United States Patent
Kroog et al.

(10) Patent No.: US 6,841,990 B2
(45) Date of Patent: Jan. 11, 2005

(54) MECHANICAL INTERFACE FOR RAPID REPLACEMENT OF RF FIXTURE COMPONENTS

(75) Inventors: Helmuth O. Kroog, Berthoud, CO (US); Timothy A. Lock, Fort Collins, CO (US); William R. Miner, Windsor, CO (US); Grant E. Cashen, Loveland, CO (US); Mark Stauder, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 280 days.

(21) Appl. No.: 10/001,630

(22) Filed: Oct. 31, 2001

(65) Prior Publication Data

US 2003/0080726 A1 May 1, 2003

(51) Int. Cl.[7] .............................................. H05K 9/00
(52) U.S. Cl. ................................. 324/158.1; 174/35 R
(58) Field of Search ..................... 324/158.1; 174/35 R, 174/35 MS; 73/431

(56) References Cited

U.S. PATENT DOCUMENTS 4,872,090 A * 10/1989 Taylor et al. ................ 316/818
6,067,866 A    5/2000 Krajec et al.
6,239,359 B1 * 5/2001 Lilienthal et al. ...... 174/35 GC

FOREIGN PATENT DOCUMENTS

DE         4107248       10/1992

* cited by examiner

Primary Examiner—Kamand Cuneo
Assistant Examiner—Russell M. Kobert

(57) ABSTRACT

A mechanical apparatus for testing a plethora of RF devices using test resources that are quickly and easily replaced is disclosed. The mechanical apparatus is located within an RF enclosure, and contains space for one or more test resources, or customizations, to be installed and applied to a device under test (DUT). The mechanical apparatus is coupled to the RF enclosure through a nest plate coupling to a drawer plate. This coupling is made into a tight seal through the use of o-ring elements that enables pneumatic pressure to be made available within the mechanical apparatus. The mechanical apparatus has a stationary base assembly, a lower nest assembly and an upper nest assembly. The DUT may be placed between the upper nest assembly and lower nest assembly, where the upper nest assembly and lower nest assembly may be coupled to test resources that may be applied to the DUT.

20 Claims, 6 Drawing Sheets

MECHANICAL INTERFACE FOR RAPID REPLACEMENT OF RF FIXTURE COMPONENTS

TECHNICAL FIELD

This invention relates generally to the field of radio frequency (RF) test and measurement systems, and more specifically to the mechanical components useful for test and measurement within RF enclosures.

BACKGROUND OF THE INVENTION

RF sealing is employed in test and production environments where the amount of radiation emitted or absorbed by an electronic device must be closely controlled. Excess RF exposure can lead to erroneous test results, or in production and operational environments, degrade the performance of equipment sensitive to the emitted radiation. RF sealing is also important when an electronic component emits sufficient radiation to impact the performance of other proximate electronic components. In this second case, RF sealing isolates the source of radiation, while the first case may be used to isolate sensitive RF components.

RF enclosures may be used in a variety of test and measurement applications when the amount of RF radiation that impacts a device under test (DUT) must be carefully controlled. Specific examples include prototype testing and production testing of cellular telephones, portable computers, pagers, and other small electronic devices. Often RF enclosures are used in automated or semi-automated environments in which machines are used to place the DUT inside the RF enclosure. In these types of test environments, it is desirable to be able to evaluate the functionality and correct operation of the DUT while the DUT is within the RF enclosure. The use of electronics circuitry and software may be used to apply specific test resources to the DUT and measure the responses. In most applications, the electronics circuitry and software are located both internal and external to the RF enclosure. Some of the electronics circuitry located internal to the RF enclosure, as well as the test functionality being controlled by the electronics, are specific to a particular type of DUT. An example of this is isolation testing of cellular phones from different manufacturers. Each phone has particular testing requirements that necessitate the use of specialized test functionality. An important issue that arises in the design of an RF fixturing device is the speed and facility with which device specific resources, also called customizations, can be replaced. This need to replace customizations can occur in a production test environment in which the DUT is changed and the RF test fixture needs to be quickly modified to match the testing requirements of the new DUT. The need for a quick replacement of device specific resources could also occur in a production environment when the device specific resources of the RF test fixture reach the end of their life cycle and fail.

The electronics and device specific resources, or customization, are located on a mechanical support and interface structure. This mechanical interface structure serves as the primary point of contact between a customization and the remainder of the RF test fixture. Thus, the need to replace device specific resources is often translated into the need for a mechanical interface and the associated interface that is easily replaced.

Many solutions exist which allow the replacement of the customization in an RF test fixture. Typically, these solutions use numerous pneumatic fittings and expensive custom designed electrical connections to accomplish this. Many require the user to disconnect pneumatic hoses and/or electrical connections individually, which adds complexity to the replacement of the customization. This adds to the time required to replace the customization and also opens the possibility of making errors in reconnecting the hoses and electrical connections causing damage to the fixture or customization. Since the interface is complex, time to develop additional customizations can be excessive. An additional issue with replacing the customization is creating a strong seal between the customization and the RF fixture. Prior solutions for making a pneumatic seal in a removable customization in an RF enclosure have been to use coupling connectors. These fittings are expensive, require additional parts and machining, require force to engage, and take up space in the customization.

Thus, there is an unmet need in the art for a RF fixturing system that contains customizations that may be quickly and easily removed, without disconnecting multiple pneumatic hoses and electrical connections individually. There is a further need in the art for a mechanical seal interface supporting a customization that does not require force to engage the seal, and requires very little space in the customization

SUMMARY OF THE INVENTION

The RF fixturing system of the present invention allows a plethora of RF devices to be tested using a standard configuration of electronics components. Testing different RF devices can be accomplished by changing the type of nest that is inserted within the RF enclosure. A nest contains RF device specific functionality. Depending upon the test and measurement requirements, multiple nests may be present within the RF fixturing system. A RF device is coupled to the nest within the RF enclosure. The nest contains specific features that allow the RF device to be properly tested or evaluated.

The nest, or "customization", is coupled to a mechanical support structure that is coupled to the RF fixture within the RF enclosure. Replacing the nest is facilitated by the design of the mechanical support structure. The mechanical support structure is designed so that the electrical connections and required pneumatic hoses are automatically connected as the mechanical support structure is engaged. So, replacing the nest is reduced to removing the mechanical support structure with the associated nest and placing a new mechanical support structure with a new nest.

One aspect of quickly replacing the customization is the ability of the mechanical support structure to quickly create a pneumatic seal with the mechanical interface of the RF fixture. This seal can be established through the use of o-rings constrained in a machined groove on a flat plate of the mechanical interface of the RF fixture. As a flat plate of the mechanical interface for the customization is placed on top of the mechanical interface of the RF fixture, the o-rings are sandwiched between the plate of the customization mechanical interface and the plate of the RF fixture mechanical interface. A fastener is then used to pull the two plates together, thereby creating a seal between the customization and the RF fixture.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
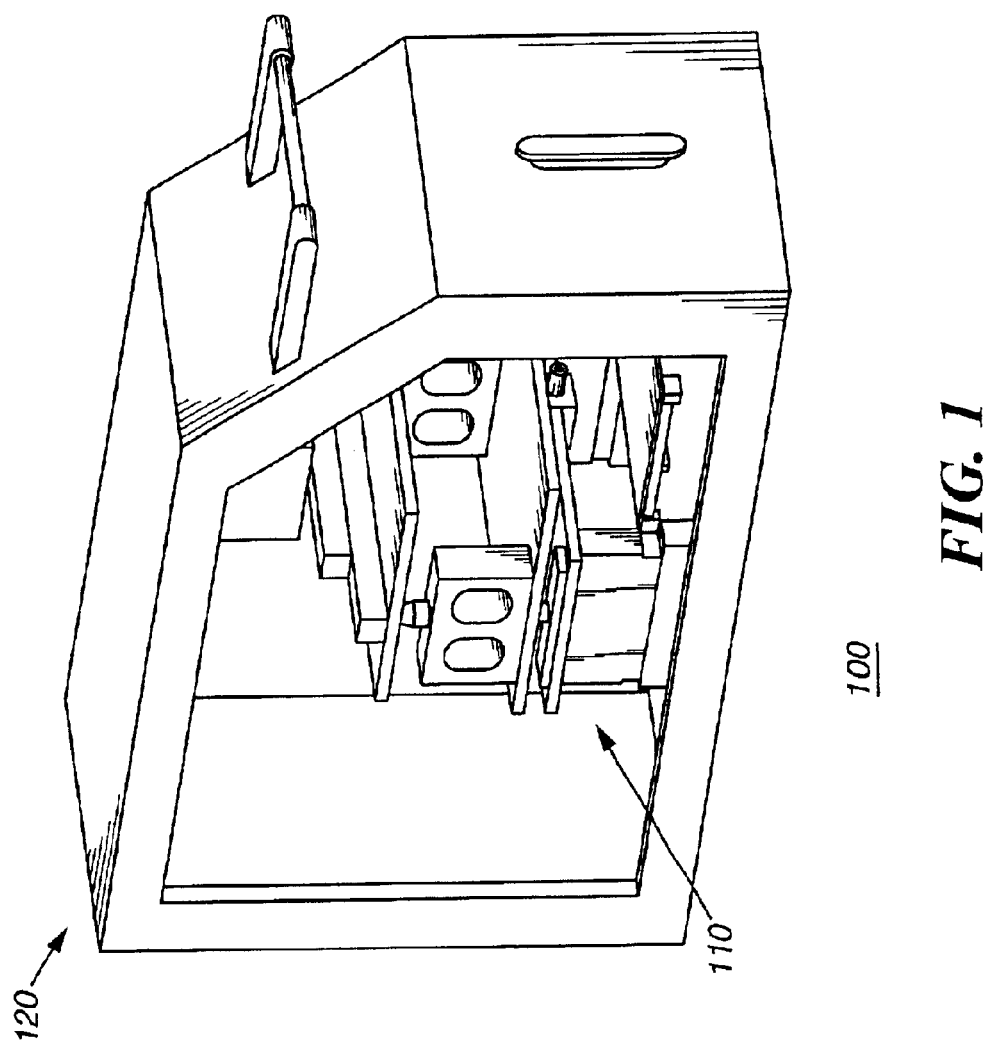
FIG. 1 is a drawing of a RF fixturing device located within an RF enclosure, according to an embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1, a drawing of an RF fixturing system 100 comprising a mechanical apparatus 110 located within an RF enclosure 120 is shown according to an embodiment of the present invention. The mechanical apparatus 110 is designed so that one or more types of nests, also called customizations, may be quickly placed within the mechanical apparatus 110. The mechanical apparatus 110 is located within RF enclosure 120, said RF enclosure 120 shielded from RF radiation so that a device under test (DUT) placed within a nest can be accurately tested.

Figure 2:
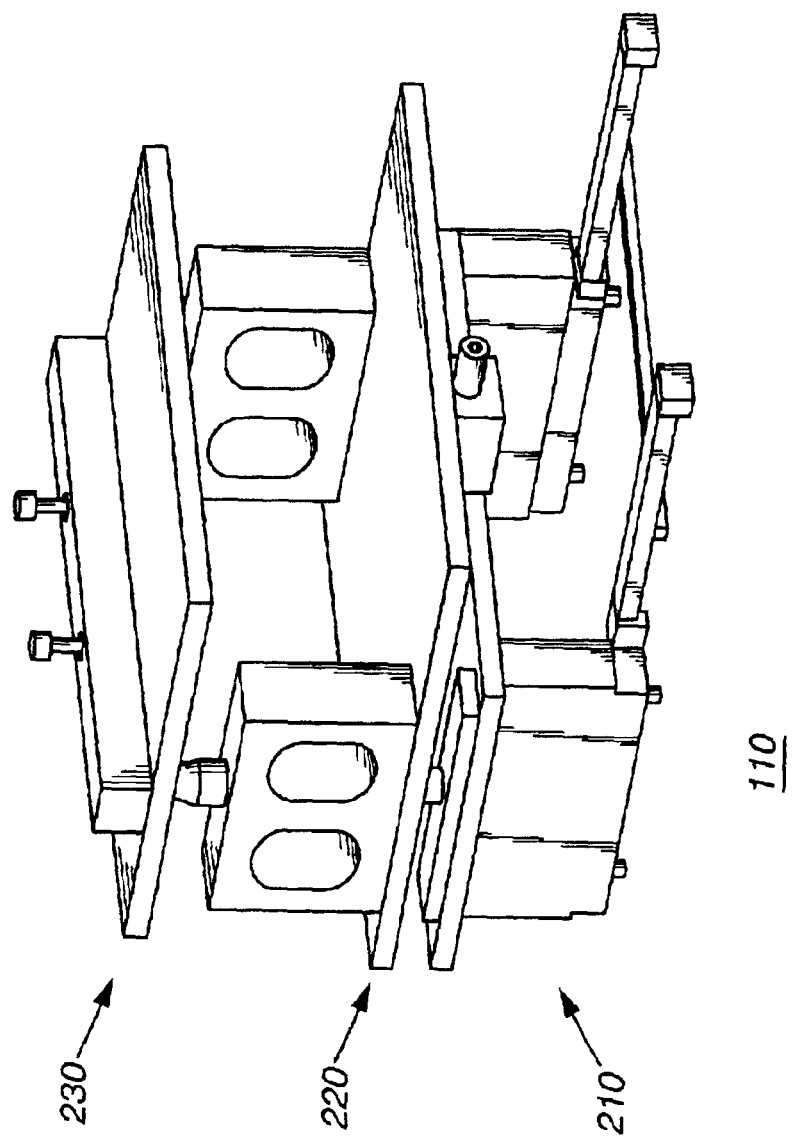
FIG. 2 is a drawing of a mechanical interface operable to support a customization, according to an embodiment of the present invention.

Referring now for FIG. 2, a more detailed drawing of the mechanical apparatus 110 is shown. The mechanical apparatus 110 comprises a stationary base assembly 210, operable to provide mechanical support to the mechanical apparatus 110. The stationary base assembly 210 is coupled to a lower nest assembly 220. The lower nest assembly 220 provides a bottom support for one or more customizations that can be placed within mechanical apparatus 110. The lower nest assembly 220 is coupled to an upper nest assembly 230. The upper nest assembly provides an upper support structure for the one or more customizations that can be placed within mechanical apparatus 110. It should be noted that the use of a fixed mechanical apparatus allows a plethora of customizations to be quickly placed within the mechanical apparatus 110. It is further noted that more than one mechanical apparatus 110 may be placed within an RF enclosure, without departing from the spirit and scope of the present invention.

Figure 3:
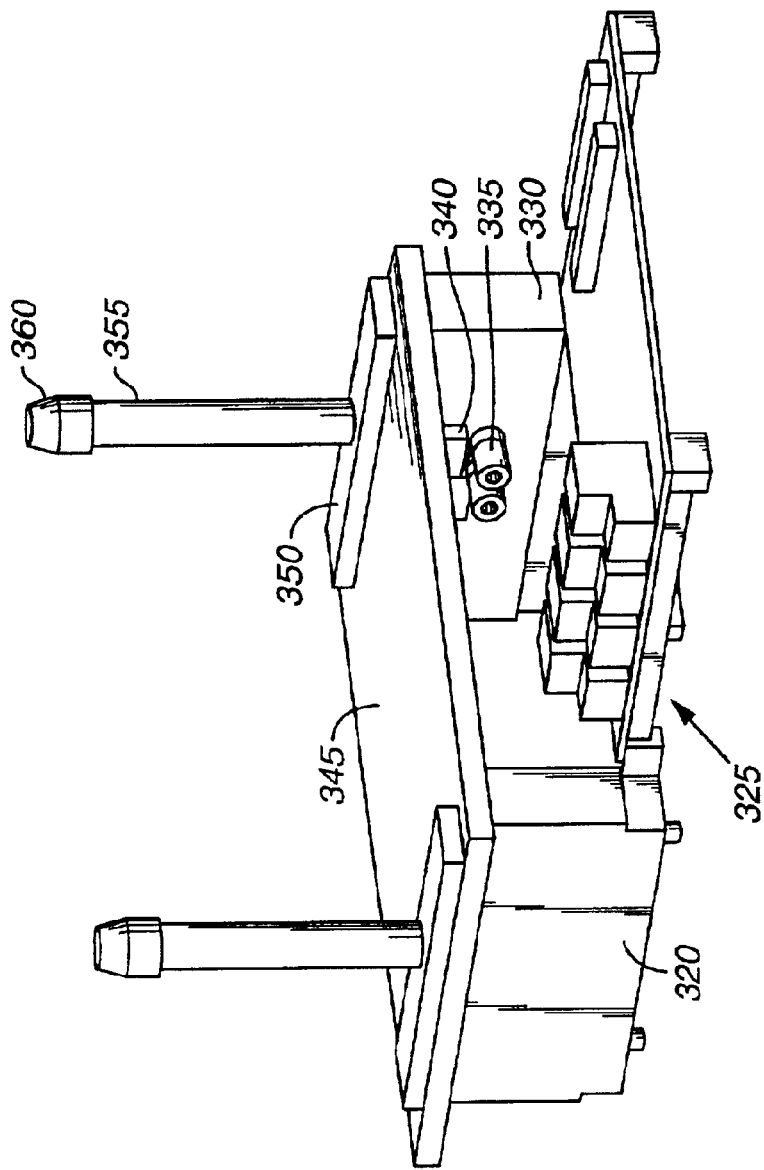
FIG. 3 is a drawing of the stationary base assembly, according to an embodiment of the present invention.

Referring now to FIG. 3, a more detailed drawing of stationary base assembly 210 is shown, according to a preferred embodiment of the present invention. The stationary base assembly 210, which provides the foundation for the mechanical apparatus 110, comprises a left standoff 320, a printed circuit assembly (PCA) mount 325 coupled to the left standoff 320 and coupled to a right standoff 330, one or more pneumatic fittings 335 and one or more unused pneumatic fittings 340 coupled to one of the left standoff 320 and right standoff 330, a base probe plate 345 coupled to the left standoff 320 and the right standoff 330, two down stops 350 coupled to the corresponding left standoff 320 and right standoff 330, and two guide shafts 355 coupled to the corresponding two down stops 350. The PCA mount 325 is operable to couple to a nest PCA, the nest PCA being able to provide test and measurement functionality applicable to a DUT. The two guide shafts 355 provide vertical stability and alignment to the mechanical apparatus 110.

Figure 4:
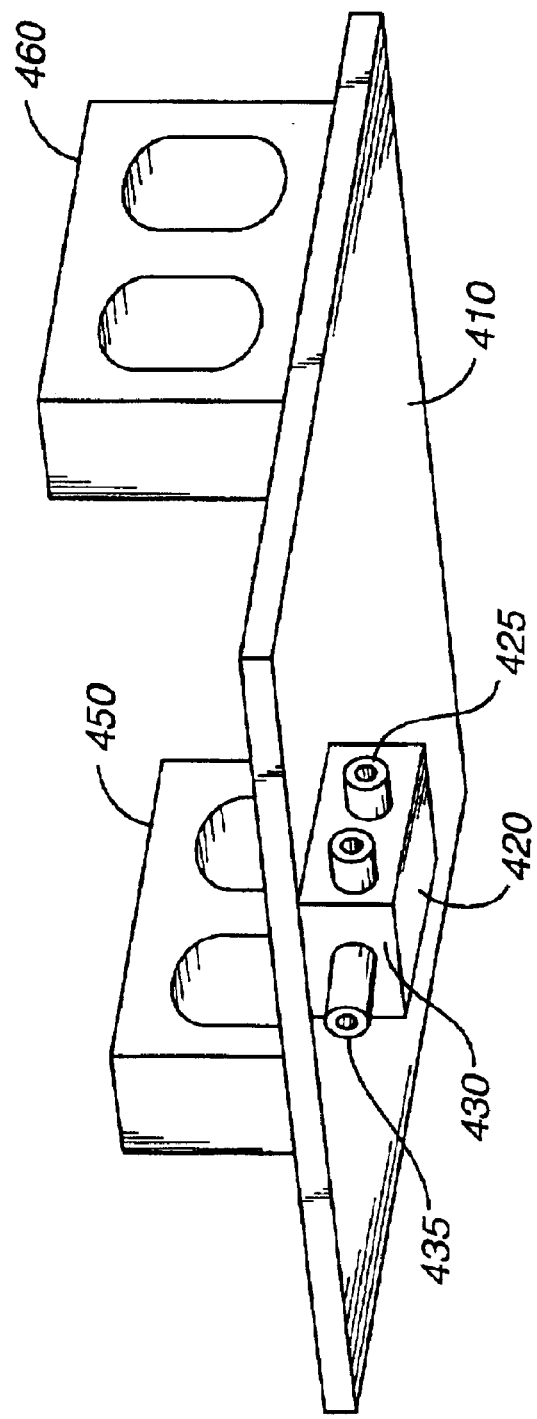
FIG. 4 is a drawing of the lower nest assembly, according to an embodiment of the present invention.

Referring now to FIG. 4, a more detailed drawing of a lower nest assembly 220 is shown, according to a preferred embodiment of the present invention. The lower nest assembly 220, which provides a mounting location and support for a DUT, further comprises a DUT support plate 410 coupled to the two guide shafts 355, a left bearing mount 450 coupled to the DUT support plate 410, a right bearing mount 460 coupled to the DUT support plate 410, and a pneumatic supply 420 coupled to the DUT support plate 410 from below. In the preferred embodiment, the pneumatic supply 420 further comprises one or more pneumatic fittings 425, a pneumatic cylinder 430, and a coupling nut 435.

Figure 5:
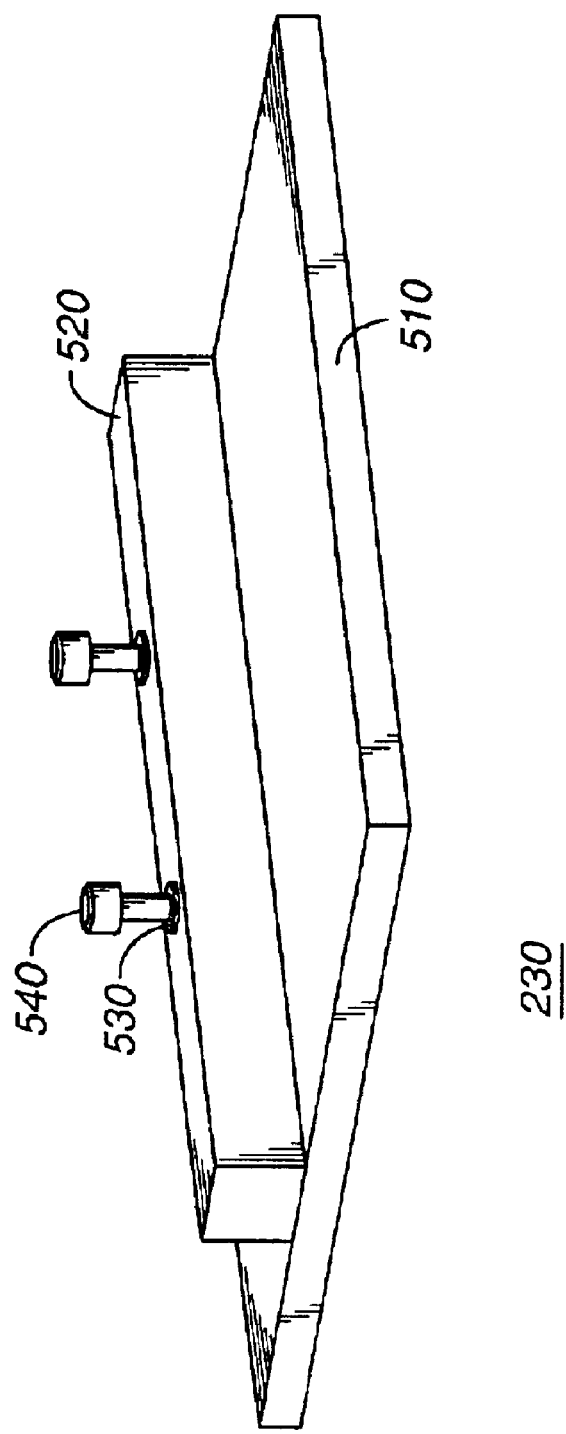
FIG. 5 is a drawing of the upper nest assembly, according to an embodiment of the present invention.

Referring now to FIG. 5, a more detailed drawing of upper nest assembly 230 is shown. Upper nest assembly 230 is operable to hold one or more test components that interface with the DUT. Exemplary test components include a microphone, a speaker, or pneumatic actuators for pushing buttons. Upper nest assembly 230 further comprises an upper nest plate 510 and a crossbar 520. In the preferred embodiment of the present invention, the crossbar 520 is coupled to the upper nest plate 510 by one or more washers 530 and one or more shoulder screws 540.

Figure 6:
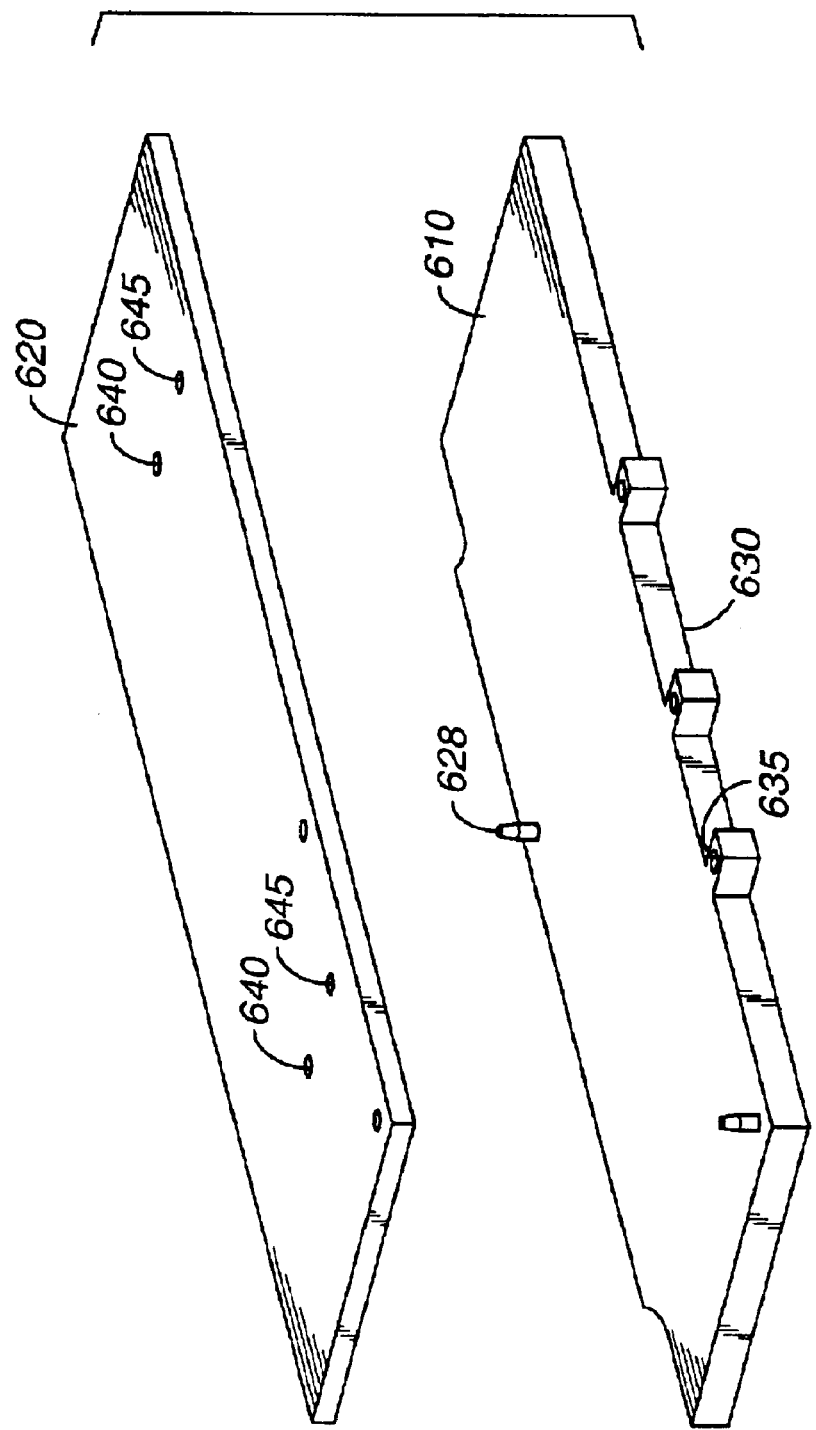
FIG. 6 is a drawing of a nest plate and a drawer plate suitable for creating a seal between a customization and an RF fixturing device, according to an embodiment of the present invention.

Referring now to FIG. 6, a side drawing of the base 600 of the mechanical apparatus 110 is shown. The base 600 comprises a drawer plate 610 coupled to a nest plate 620. The nest plate 620 is further coupled to the stationary base assembly 210. The drawer plate 610 comprises one or more locating pins 625 operable to enable the nest plate 620 to be aligned with respect to drawer plate 610, one or more o-rings 630 located in a corresponding one or more circular holes, and one or more pneumatic fittings (not shown in the figure) coupled to the one or more circular holes from below. The drawer plate 610 further comprises one or more screw holes 635, said screw holes operable to be coupled to one or more corresponding fasteners 640 to tightly couple the drawer plate 610 to the nest plate 620. The nest plate further comprises one or more screw holes 645 operable to be coupled to the one or more corresponding fasteners 640.

In the preferred embodiment of the present embodiment, when replacing the mechanical apparatus 110, the one or more locating pins 625, the one or more fasteners 640, and the one or more screw holes 645 allow a fast coupling to be established between the drawer plate 610 and the nest plate 620. This fast coupling is made a tight seal through the use of the one or more o-rings 630.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A mechanical apparatus operable for rapid replacement of one or more RF fixture customizations, comprising:

an RF enclosure;

a drawer base plate, coupled to the RF enclosure;

a nest stationary base plate, coupled to the drawer base plate, said nest stationary base plate further comprising:

one or more o-rings, coupled to one or more holes located in stationary base plate and coupled to one or more corresponding holes in the drawer base plate;

one or more fasteners, coupled to the nest stationary base plate in one or more locations and coupled to the drawer base plate in the one or more locations;

one or more electrical connectors, coupled to the nest stationary base plate, said one or more electrical connectors operable to carry electrical signals;

one or more pneumatic actuators, coupled to the nest stationary base plate, said one or more pneumatic actuators operable by pressurized gas provided to one or more corresponding nests through the one or more o-rings;

a stationary base assembly, coupled to the nest stationary base plate;

one or more lower nest assemblies, coupled to the stationary base assembly, said one or more lower nest assemblies operable to support the one or more corresponding nests; and one or more upper nest assemblies, coupled to the one or more corresponding lower nest assemblies, said one or more upper nest assemblies operable to support the one or more corresponding nests.

2. The mechanical apparatus of claim 1, wherein the drawer base plate comprises one or more guide plates, said guide plates operable to enable the nest stationary base plate to be oriented with respect to the drawer base plate.

3. The mechanical apparatus of claim 1, wherein the one or more o-rings are placed on two straight lines along the long axis of the drawer base plate.

4. The mechanical apparatus of claim 1, wherein the one or more pneumatic fittings are place below the one or more o-ring locations.

5. The mechanical apparatus of claim 1, wherein the fastener tightens the drawer plate to the stationary base plate.

6. The mechanical apparatus of claim 1, wherein the one or more lower nest assembly and the upper nest assembly contain one or more alignment features suitable for aligning a lower nest assembly with the corresponding upper nest assembly.

7. The mechanical apparatus of claim 1, wherein the stationary base assembly further comprises:

a base probe plate;

one or more guide shafts, coupled to the base probe plate;

one or more locating cones for upper nest assembly alignment, coupled to the guide shaft;

one or more down stops, coupled to the one or more guide shafts and coupled to the base probe plate from above;

a left standoff, coupled to the base probe plate from below;

a right standoff, coupled to the base probe plate from above;

one or more pneumatic fittings, coupled to one of the left standoff and the right standoff; and a PCA mount, coupled to the right standoff and coupled to the left standoff.

8. The mechanical apparatus of claim 1, wherein the lower nest assembly further comprises:

a left bearing mount, coupled to the upper nest assembly;

a right bearing mount, coupled to the upper nest assembly;

DUT support plate, coupled to the stationary base assembly, coupled to the right bearing mount, and coupled to the left bearing mount; and a pneumatic air supply assembly, coupled to the DUT support plate, said pneumatic air supply assembly operable to supply pressurized air to a nest.

9. The mechanical apparatus of claim 1, wherein the upper nest assembly further comprises:

an upper nest plate, coupled to the lower nest assembly;

a cross bar, coupled to the upper nest plate; and one or more screws, coupled to the cross bar, said one or more screws operable to coupled the upper nest assembly to the lower nest assembly.

10. A mechanical apparatus operable for rapid replacement of one or more RF fixture customizations, further comprising:

an RF enclosure;

a drawer base plate, coupled to the RF enclosure;

a nest stationary base plate, coupled to the drawer base plate;

a stationary base assembly, coupled to the nest stationary base plate;

one or more lower nest assemblies, coupled to the stationary base assembly, said one or more lower nest assemblies operable to provide support from below to the one or more corresponding nests; and one or more upper nest assemblies, coupled to the one or more corresponding lower nest assemblies, said one or more upper nest assemblies operable to provide support from above to the one or more corresponding nests.

11. The mechanical apparatus of claim 10, wherein the drawer base plate comprises one or more guide plates, said guide plates operable to enable the nest stationary base plate to be oriented with respect to the drawer base plate.

12. The mechanical apparatus of claim 10, wherein the one or more lower nest assembly and the upper nest assembly contain one or more alignment features suitable for aligning a lower nest assembly with the corresponding upper nest assembly.

13. The mechanical apparatus of claim 10, wherein the stationary base assembly further comprises:

a base probe plate;

one or more guide shafts, coupled to the base probe plate;

one or more locating cones for upper nest assembly alignment, coupled to the guide shaft;

one or more down stops, coupled to the one or more guide shafts and coupled to the base probe plate from above;

a left standoff, coupled to the base probe plate from below;

a right standoff, coupled to the base probe plate from above;

one or more pneumatic fittings, coupled to one of the left standoff and the right standoff; and a PCA mount, coupled to the right standoff and coupled to the left standoff.

14. The mechanical apparatus of claim 10, wherein the lower nest assembly further comprises:

a left bearing mount, coupled to the upper nest assembly;

a right bearing mount, coupled to the upper nest assembly;

DUT support plate, coupled to the stationary base assembly, coupled to the right bearing mount, and coupled to the left bearing mount; and a pneumatic air supply assembly, coupled to the DUT support plate, said pneumatic air supply assembly operable to supply pressurized air to a nest.

15. The mechanical apparatus of claim 10, wherein the upper nest assembly further comprises:

an upper nest plate, coupled to the lower nest assembly;

a cross bar, coupled to the upper nest plate; and one or more screws, coupled to the cross bar, said one or more screws operable to coupled the upper nest assembly to the lower nest assembly.

16. A mechanical apparatus operable for rapid replacement of one or more RF fixture customizations, further comprising:

an RF enclosure;

a drawer base plate, coupled to the RF enclosure;

a nest stationary base plate, coupled to the drawer base plate, said nest stationary base plate further comprising:

one or more o-rings, coupled to one or more holes located in stationary base plate and coupled to one or more corresponding holes in the drawer base plate; and one or more fasteners, coupled to the nest stationary base plate in one or more locations and coupled to the drawer base plate in the one or more locations.

17. The mechanical apparatus of claim 16, wherein the drawer base plate comprises one or more guide plates, said guide plates operable to enable the nest stationary base plate to be oriented with respect to the drawer base plate.

18. The mechanical apparatus of claim 16, wherein the one or more o-rings are placed on two straight lines along the long axis of the drawer base plate.

19. The mechanical apparatus of claim 16, wherein the one or more pneumatic fittings are place below the one or more o-ring locations.

20. The mechanical apparatus of claim 16, wherein the fastener tightens the drawer plate to the stationary base plate.

* * * * *

UNITED STATES PATENT AND TRADEMARK OFFICE
CERTIFICATE OF CORRECTION

PATENT NO. : 6,841,990 B2
DATED : January 11, 2005
INVENTOR(S) : Helmuth O. Kroog et al.

It is certified that error appears in the above-identified patent and that said Letters Patent is hereby corrected as shown below:

<u>Column 8,</u>
Line 19, after "base plate", insert
--21. A mechanical apparatus operable for
    rapid replacement of one or more RF fixture customizations, further
    comprising:
    an RF enclosure;
    a nest stationary base plate, coupled to the RF enclosure;
    a stationary base assembly, coupled to the nest stationary base
    plate;
one or more nest assemblies, coupled to the stationary base assembly,
said one or more nest assemblies, operable to provide support to one or
more corresponding nests.
    22. A mechanical appraratus operable for rapid replacement of one or more
    RF fixture customizations, further comprising:
  one or more o-rings, coupled to one or more holes in the RF enclosure; and one or
more fasteners, coupled to the nest stationary
base plate and coupled to one or more corresponding holes in the RF
enclosure; and
    one or more fasteners, coupled to the nest stationary base plate in one or
    more locations and coupled to the RF enclosure in the one or more
    locations. --

Signed and Sealed this

Tenth Day of May, 2005

JON W. DUDAS
*Director of the United States Patent and Trademark Office*